United States Statutory Invention Registration [19]

[11] Reg. Number: H154

Boyce et al.

[43] Published: Nov. 4, 1986

[54] FLASH PREFIRE DETECTOR

[75] Inventors: Gary L. Boyce, Forest Hills; Grat E. Blackburn, Street, both of Md.

[73] Assignee: The United States of America as represented by the Secretary of the Army, Washington, D.C.

[21] Appl. No.: 756,010

[22] Filed: Jul. 16, 1985

Related U.S. Application Data

[63] Continuation of Ser. No. 573,096, Jan. 23, 1985.

[51] Int. Cl.[4] ..... H05G 1/64; H05G 1/22

[52] U.S. Cl. ..... 378/98; 378/106; 340/79; 340/332; 340/531

[56] References Cited

PUBLICATIONS

"Master Replacement Guide," Sylvania ECG Semiconductors (1978), p. 26.

*Primary Examiner*—Stephen C. Buczinski
*Assistant Examiner*—Linda J. Wallace
*Attorney, Agent, or Firm*—Anthony T. Lane; Robert P. Gibson; Michael C. Sachs

[57] ABSTRACT

A circuit having indication lights for demonstrating when a flash triggering pulse has been fed to an X-ray photographic system or the like, is provided. The invention is especially useful in noting that a false triggering pulse, or prefire had inadvertently happened to a flash unit of an X-ray system before it was intended to be used, thus triggering it to photograph, ruining its film. This invention is also useful in that it marks which in a plurality of systems had been the one that had been falsely triggered, and additionally useful in marking that all of the said units had been properly triggered when a true pulsing had been engaged for all units, or of marking which unit had failed to fire.

2 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FLASH PREFIRE DETECTOR

GOVERNMENTAL INTEREST

The invention described herein may be manufactured, used and licensed by for the Government for Governmental purposes without the payment to me of royalties thereon.

This application is a continuation of application Ser. No. 573,096, filed Jan. 23, 1985.

BACKGROUND AND FIELD OF THE INVENTION

This invention relates to the field of electrical switching indication in general and particularly to the field of prefire detection in X-ray system flash units. A continuing problem in the use of triggered flash, X-ray photography systems is the occurence of a false triggering or prefire. A prefire condition can cause premature exposure of the film loaded in the X-ray system, and if undetected, results in wasted effort following the time of the prefire. An operator would unwittingly continue to take photographic runs with film that had already been fogged or otherwise prematurely exposed. Those poor runs would result in at least a fogged shot and perhaps a double exposed or likely totally useless shot. It is naturally important therefore to reload all the film cassettes of such a system once the operator has knowledge that a prefire had occured; and it is also quite important to be able to detect such occurence of prefire or misfire. In one conventional method to detect prefire and misfire in such photographic systems. A surge on the input triggering line to the X-ray system is noted by a meter provided in series therewith on the inlet line or in some parallel arrangement therewith. In this arrangement, the operator must note a sudden dip or deviation of the meter indicator vane. Noteworthy with this approach is that the deviation may unfortunately often go totally unnoticed by the operator. Another convention of mention is to include a flickering light connected at the trigger input of the said system which might be arranged to flicker perhaps once during momentary surges or to light only during surges. This approach seems better than the meter as far as noticing the surges, however it still has the disadvantage of the operator often not noticing the occurrence of the prefire/misfire condition. The aforedescribed shortcomings become especially serious in the case of a multiple X-ray system, arranged for photographing a given scene perhaps in time sequence or possibly simultaneously from different vantage points instead. As many as thirty different systems might be operated simultaneously in order to photograph the scene and a prefire of only one of those many systems might not even be noticed amongst all thirty meters or only too briefly in the case of flickering lights. In such multi-channel arrays even when a prefire had definitely been noticed by an operator according to either one of the above-described methods, it is not likely he might still recall which of the many units was the one that had misfired. The severe shortcomings of not being able to pinpoint the particular unit having the problem necessitate unfortunately, the reloading each and every one of the units with new film with accompanying great amount of wasted time, the wasted cost of discarding perhaps all the film cartridges, and the wasted time in having shots of at least one spoiled unit which need retaking causing retake of an entire sequence of shots if a complete test run is thus spoiled. Clearly therefore, it is highly desirable to provide a detection device which would overcome the aforesaid disadvantages and assure the integrity of photographic runs and unexposed film in each X-ray system.

BRIEF DESCRIPTION OF THE INVENTION

A respective detector circuit is provided for each flash unit in the particular X-ray system, for which unit it is desired to mark whether or not it had been triggered. An essential benefit in this invention is to have a light running steady-on following a triggering, not just during a surge. A lamp is included with each detector circuit, the lighting of which lamp is to signify that the flash unit had been subjected to an operational pulse such as when it is usually operated. Operation here includes either a desired triggering, to mark the unit that had been on, or had an accidental triggering, or a prefire. A lamp is included in the circuit of the cathode of a suitably biased SCR switching device in series with a power source, the positive side of which source had been grounded. The circuit of the anode side of the SCR device is connected to feed a pulse to a flash unit, through the SCR. The flash power comes from the power source but is actually switched on by the SCR guide, by applying the subject triggering pulse at the cathode gate side of the SCR to switch it on. An R-C discharge circuit with series diode is first fed by said triggering pulse, to spread the time of the pulse surge and generally to build up a voltage sufficient for eventually switching on the SCR. The SCR after being switched on and thus the lamp too, remains on thereafter until the circuit from the SCR to the flash unit is broken as by opening switch 108 which is usually left closed but which however is opened for purposes of breaking the circuit to shut off the light; the switch is immediately re-closed again after the light goes off in order to reset the circuit for again marking the next time a triggering pulse appears. A suitable embodiment for switch 108, for example could be a toggle switch, home light switch, even a push button break switch, or a spring loaded normally closed switch. Suitable biasing and feedback resistor elements for the SCR are provided to enable the SCR to switch at the anticipated voltage levels to be encountered.

OBJECTS OF THE INVENTION

Accordingly, it is an object of this invention to provide means for marking a flash unit of an X-ray system which has been in fact previously operated so that fresh film may be reloaded therein where needed.

Another object is to provide a means of marking which X-ray system, or systems within relatively a large plurality of similar systems had been the ones falsely triggered to operate, so that their film may be changed before proceeding further.

Other objects and advantages of this invention will become readily apparent to those skilled in the art from a reading of the attached description wherein like numerals and captions refer to their counterparts in the appended drawings in which:

LIST OF FIGURES

FIG. 1 illustrates a plural flash system layout with plurality of respective individual detector circuits for marking the occurence of a use of a circuit's respective flasher unit; and FIG. 2 shows a schematic diagram of one possible embodiment of a detector circuit according to this invention.

DETAILED DESCRIPTION OF THE INVENTION

Figure 1:
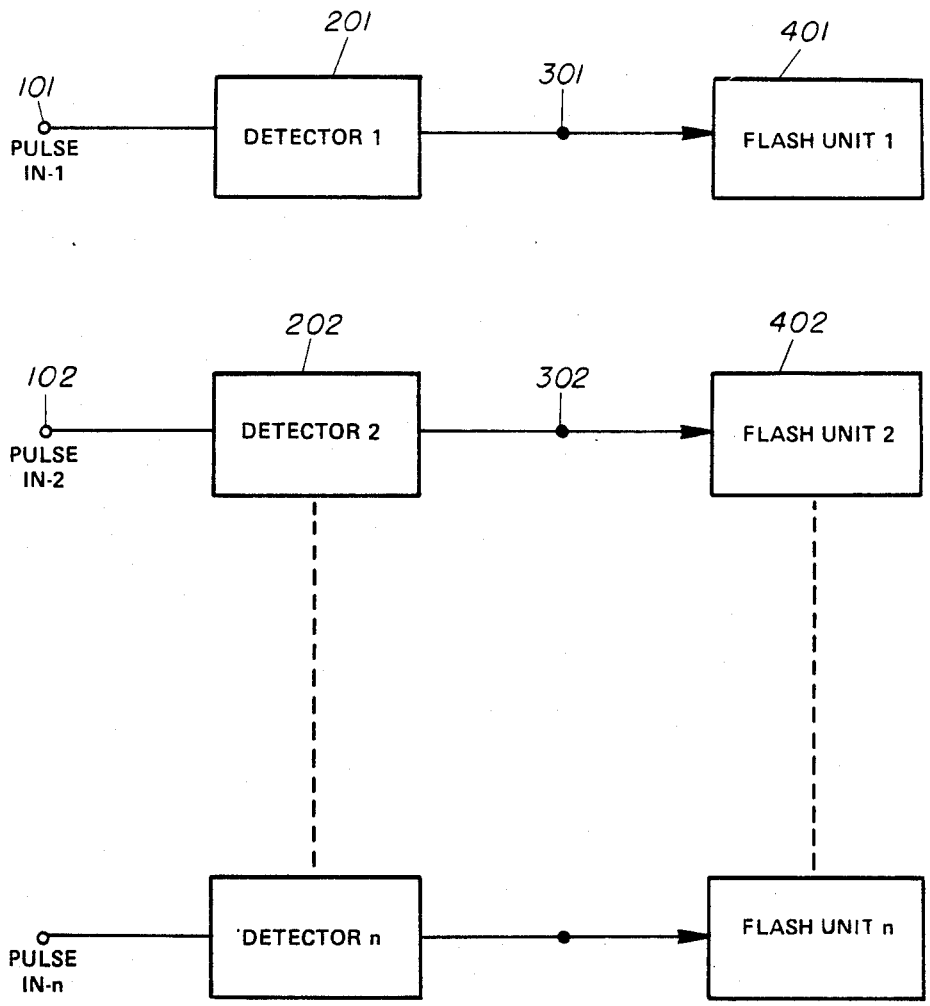

The above-mentioned features and advantages are accomplished with use of the within described invention. FIG. 1 illustrates a multiple bank of X-ray system flash units 1 through n, 401, 402, . . . , etc. triggered by a plurality of respective pulses 1 through n, 101, 102, . . . , which pulses are first made to pass through the added detector units 1 through n, 201, 202, . . . , etc. of this invention. It is a function of each detector unit to provide a steadily-on light device which is brought ON upon the occurrence of a prefire, misfire, or an intentional fire, e.g. Another characteristic of this detector device is that the light will remain on until reset by the operator, this making it likely that the prefire will be discovered. Since each X-ray system has its own detector unit and each detector unit its own light it is possible to know which X-ray system it is that has had the accidental prefire in addition to having a steady-on indication of such mishap.

Figure 2:
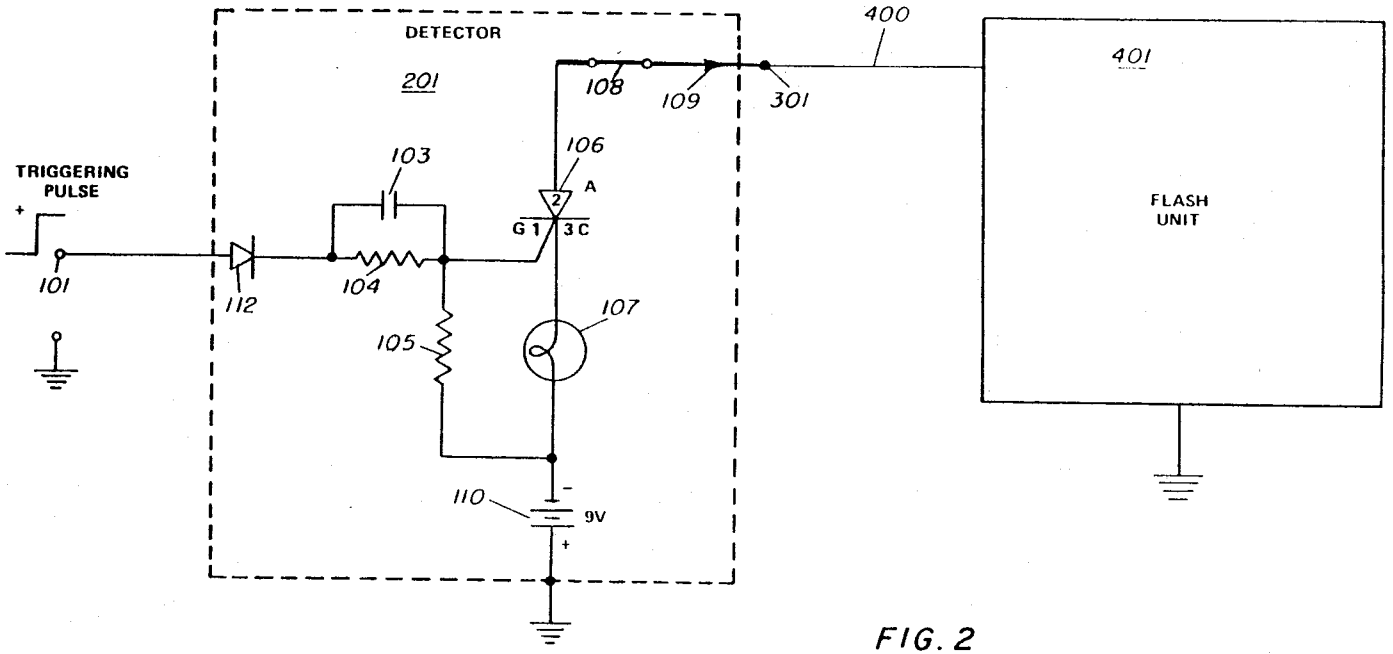

In FIG. 2, one embodiment of a detector unit is shown in schematic form. A triggering pulse which would ordinarily be fed directly to an X-ray flash unit 401 is instead fed to it only first by way of a detector unit 201. This fairly large, positive going pulse is first passed through a diode unit 112. Diode 112 serves not only to block any negative wave signals from passing further into the detector circuit, but also isolates terminal 101, i.e., it serves to prevent any positive going large voltage surges in the R-C circuit 103, 104 from returning backward through the diode to 101. Thereafter, the full build up of voltage in the R-C circuit can be used to bias on SCR switch 106, at its terminal 1 (cathode gate). It should be noted that the R-C network elongates the signal to allow enough time for the gate of the SCR device to operate. This permits the full power from the R-C circuit to pass through 106, along the path of switch 108, and appear as signal 109, at output terminal 301, which passes out to activate flash unit 401. It is assumed that the X-ray flash unit of the type discussed here without any specific type mentioned, may be started by a trigger pulse as small as 9 volts such as used here. This is possible for example, because such units have low-power level (for safety) switches, operable by humans; the switches are typically connected to internal relays which can handle the (possible) Kilovolts involved in an X-Ray machine. The high level voltage is of course not at the fingertips of the human operator because of the great danger, internal relays are used, turned on by low power level, human operated, switches. While such relay(s) is not shown within the generalized rectangular box symbolically representing flash unit 401, it is understood that commercial X-Ray units employ such switch methods for remotely turning on the very high power levels of an X-Ray, and that the approximate 9 volt pulse from detector unit 201 will be fed to those locations in the X-Ray machine where a (low power level) switch would have been turned on by a human, if there had been no detector unit intervening. As such then, the power being made to travel along line 400 is only a symbolical way to show that the X-Ray unit is to be turned on by a pulse, following the setting of the detector system. Once the SCR is on, the path through lamp 107 will remain on; i.e. the path of battery 110, through lamp 107, SCR 106 from terminal 3 (cathode) to terminal 2 (anode), closed switch 108, line 400 to grounded case of 401, back through the grounded case of 201 to grounded battery 110, remains on by battery power without any further pulses needed at 101. There is no path, at this stage of the operation, that would take one back through both lamp 107 and the diode 112, out to terminal 101, because there is no longer any pulse at 101 to complete that path. There is some voltage drop in the SCR from 3 to 2 so that lamp 107 chosen should be capable of operating on less than the full 9 volts in battery 110. In order to select the ohmic value of resistor 105, it must be considered to be of such proportion to the value of resistor 104 so as not to permit the junction 1 to 3 to be biased on without the additional power of the surge from the R-C circuit 103, 104 caused by the pulse at 101. A good proportion is at least 1:100 of resistor 105 to resistor 104. Flash unit 401 is merely a block representative of any X-ray system flash unit as described earlier which has a flash type operation to photographically expose its film during a shot of some desired scene and is in need of an invention of this sort. In the normal operation, a proper firing of the system will of course also trigger the lamp light in the detector unit to go on. This has the advantage of assuring the operator that all units have fired properly. However it has the disadvantage that after each firing of the plurality of X-ray units to take shots it will therefore become necessary to reset all the detector units or otherwise perhaps automatically provide therefor. One method of resetting is of automatically disconnecting the 9 volt power supply feeding all detector units after a shot, by other circuitry means not shown, which power off would definitely shut off all the lamps for a reset without resort to resetting all the toggle switches of each and every detector unit. Other switching elements than the shown SCR can be useful in this type circuit following the principles taught herein; here an ECG-5457 has been used. A listing of circuit element values useful in the system of FIG. 2 appears below. It is nonetheless stressed however that any elements, values, or even other circuit arrangements which could fulfill the basic functions of the intended circuit, would likewise be just as acceptable. The specific elements below are not limiting, but only exemplary to aid in an understanding of the use of this invention.

| Element | Identification |
|---|---|
| 112 | ECG-177 diode |
| 103 | 0.001 mf. |
| 104 | 100 KΩ |
| 105 | 1 KΩ |
| 106 | ECG-5457, SCR |
| 110 | 9 volt voltage source |
| 107 | 9 volt lamp |

While the invention may have been described with respect to one particular embodiment or embodiments, it should be understood by those skilled in the art that the description also includes all equivalents, substitutions and modifications within the spirit and scope of the invention, the specification or the claims.

What is claimed is:

1. In an X-ray system having plural flash units for photographing a subject, the flash units operated by a trigger signal, a flash unit trigger indication system including a plurality of detector circuits each one respectively in series with a triggering input to each said X-ray flash unit, each of said detector circuits comprising:

an SCR semiconductor switching device comprising a terminal leading to the cathode gate side of the SCR, at which terminal is fed a triggering pulse intended for triggering a respective flash unit, the anode side of the SCR being connected to the flash unit for passing a triggering signal thereto, for initiating its operation for flashing, each of said flash units being grounded;

a positive grounded voltage source;

a lamp unit connected between the cathode terminal of the SCR and the negative side of said voltage source, creating an indication in the cathode circuit path that said SCR has been turned on and operated, and hence that the voltage source has been fed to trigger a respective flash unit through a turned on SCR, a lighting of a respective lamp unit indicating a triggering of a respective flash unit;

a switch connected in series between each respective flash unit and the anode terminal of the SCR in its respective detector circuit, said switch being opened for turning off a respective lamp indication in addition to turning off the SCR until its next operation.

2. The indication system of claim 1 wherein there is further included between the said terminal and cathode gate of said SCR, a series diode and a R-C delay circuit in series therewith, for aid in triggering the said SCR device.

* * * * *